United States Patent
Baranwal et al.

(10) Patent No.: US 10,439,482 B2
(45) Date of Patent: Oct. 8, 2019

(54) ADAPTIVE DRIVE STRENGTH SWITCHING CONVERTER

(71) Applicant: TEXAS INSTRUMENTS INCORPORATED, Dallas, TX (US)

(72) Inventors: Shailendra Kumar Baranwal, Murphy, TX (US); William Todd Harrison, Apex, NC (US); Yogesh Kumar Ramadass, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/713,204

(22) Filed: Sep. 22, 2017

(65) Prior Publication Data

US 2019/0097517 A1    Mar. 28, 2019

(51) Int. Cl.
| | |
|---|---|
| *H02M 3/157* | (2006.01) |
| *H02M 1/08* | (2006.01) |
| *H02M 3/156* | (2006.01) |
| *H02M 1/44* | (2007.01) |
| *H03K 17/16* | (2006.01) |
| *H02M 3/158* | (2006.01) |
| *H02M 1/00* | (2006.01) |

(52) U.S. Cl.
CPC .............. *H02M 1/08* (2013.01); *H02M 1/44* (2013.01); *H02M 3/156* (2013.01); *H03K 17/166* (2013.01); *H02M 2001/0048* (2013.01); *H03K 2217/0081* (2013.01)

(58) Field of Classification Search
CPC ......... H02M 2001/0025; H02M 3/156; H02M 3/157; H02M 3/158; H02M 3/1588; H02M 1/08
See application file for complete search history.

(56) References Cited

U.S. PATENT DOCUMENTS

| | | | | |
|---|---|---|---|---|
| 4,947,169 A | * | 8/1990 | Smith ................. | H03M 1/1057 341/118 |
| 5,304,917 A | * | 4/1994 | Somerville ........... | H02J 7/0081 320/148 |
| 8,742,740 B2 | * | 6/2014 | Zeng ..................... | G01R 19/04 323/283 |
| 8,970,196 B2 | * | 3/2015 | Henzler ............... | H02M 3/156 323/283 |
| 9,099,924 B2 | * | 8/2015 | Galloway ............ | H02M 3/156 |
| 2014/0184187 A1 | * | 7/2014 | Hwang ................. | H02M 3/157 323/283 |
| 2014/0266141 A1 | * | 9/2014 | Isham ...................... | G06F 1/26 323/318 |
| 2017/0346402 A1 | * | 11/2017 | Ishino .................... | H02M 1/083 |
| 2017/0373594 A1 | * | 12/2017 | Childs ..................... | H02M 1/08 |
| 2018/0083524 A1 | * | 3/2018 | Childs .................... | H02M 3/157 |

* cited by examiner

*Primary Examiner* — Gary L Laxton
(74) *Attorney, Agent, or Firm* — Michael A. Davis, Jr.; Charles A. Brill; Frank D. Cimino

(57) ABSTRACT

In an embodiment, an adaptive drive strength switching converter includes a driver and a control loop coupled to the driver. In an embodiment, the control loop includes a peak detector, a comparator coupled to an output of the peak detector, a counter coupled to an output of the comparator, and a digital-to-analog converter (DAC) coupled to an output of the comparator.

12 Claims, 5 Drawing Sheets

ADAPTIVE DRIVE STRENGTH SWITCHING CONVERTER

BACKGROUND

Switching converters are a form of power converter that converts an input voltage to an output voltage. The switching converters convert the input voltage to the output voltage by turning one or more components of the switching converter on and/or off in rapid succession. In doing this, certain challenges may arise which may affect operation of the switching converter and/or a value of the output voltage.

SUMMARY

In some embodiments, an adaptive drive strength switching converter comprises a driver and a control loop coupled to the driver. The control loop comprises a peak detector, a comparator coupled to an output of the peak detector, a counter coupled to an output of the comparator, and a digital-to-analog converter (DAC) coupled to an output of the comparator.

In some embodiments, a control loop comprises a peak detector having an input to receive a signal at least partially based on an output of a half-bridge circuit. The control loop also comprises a comparator having a first input coupled to an output of the peak detector and a second input to receive a desired reference value. The control loop further comprises a counter having an input coupled to an output of the comparator. The control loop additionally comprises a DAC having an input coupled to an output of the counter.

In some embodiments, a method comprises receiving an output of an adaptive drive strength switching converter. The method also comprises determining a maximum value of the output of the adaptive drive strength switching converter. The method further includes comparing the maximum value of the output of the adaptive drive strength switching converter to a reference value to generate a comparison result. The method additionally comprises modifying a digital count value based on the comparison results. The method also includes converting the digital count value to a signal at least partially usable to drive a component of the adaptive drive strength switching converter, wherein the component at least partially produces the output of the adaptive drive strength switching converter.

BRIEF DESCRIPTION OF THE DRAWINGS

For a detailed description of various examples, reference will now be made to the accompanying drawings in which.

DETAILED DESCRIPTION

Figure 1:
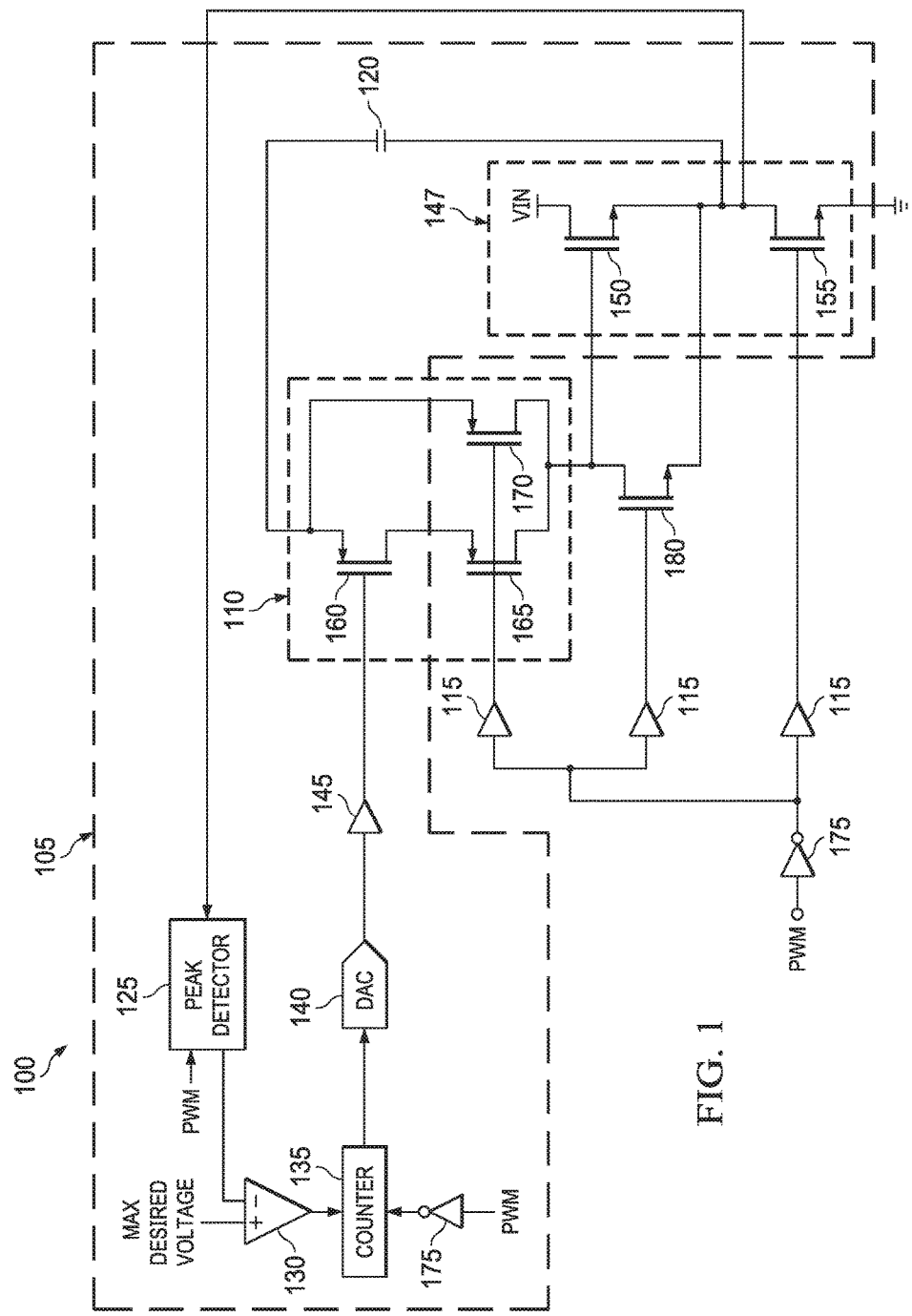
FIG. 1 shows a schematic diagram of an illustrative adaptive drive strength switching converter in accordance with various embodiments.

A switching converter is operable to receive an input signal at a first voltage magnitude and provide an output signal at a second voltage magnitude that may be less than, greater than, or equal to the first voltage magnitude. Implementation cost and performance of switching converters may be related to (e.g., limited by) voltage ratings of at least some components included in the switching converters. For example, the voltage ratings may be maximum voltage magnitudes allowed at one or more terminals of at least some components included in the switching converter. These limitations of existing switching converters may result in less than optimal performance, operable voltage range (of input and/or output), and cost of production.

Disclosed herein are embodiments that provide for adaptive drive strength control of a switching converter. The disclosed embodiments provide for an adaptive drive throttled switching converter including components operable to function in the adaptive drive throttled switching converter outside of these voltage ratings. For example, in at least some embodiments, components with comparatively low voltage ratings are operable at comparatively high input voltages that exceed the low voltage ratings. For example, the low voltage ratings and high input voltages may be with respect to, and an improvement over, presently known techniques in which components with comparatively high voltage ratings are utilized to enable the comparatively high input voltages. Such improvement, in some embodiments, reduces implementation cost of the adaptive drive throttled switching converter and/or increases performance of the adaptive drive throttled switching converter at various input voltage ranges.

In some embodiments, the disclosed adaptive drive throttled switching converter includes a control loop and at least one driver. In various embodiments, the control loop includes a sample-and-hold circuit, a comparator, an n-bit counter (e.g., up and/or down counter), an n-bit digital-to-analog converter (DAC), an amplifier, a transistor (or other form of controllable switch), and/or a half-bridge (e.g., high-side and low-side power metal oxide semiconductor field effect transistors (MOSFETs)). In an embodiment, the driver comprises a plurality of transistors (e.g., p-type MOSFETS) operable to drive at least a portion of the half-bridge of the control loop. In some embodiments, the transistor of the control loop is included within, or is a component of, the driver. In some embodiments, a plurality of drivers are coupled in parallel in the adaptive drive throttled switching converter. A strength of a drive signal of the adaptive drive throttled switching converter (used for driving the half-bridge) controls an output of the adaptive drive throttled switching converter. In some embodiments, it may be desirable to operate the adaptive drive throttled switching converter as near as practicable to a breakdown voltage of the at least some components of the adaptive drive throttled switching converter (e.g., such as the high-side and low-side MOSFETs of the half-bridge). In some embodiments, the strength of the drive signal is determined based on a desired set-point or reference signal and an output of the adaptive drive throttled switching converter. In some embodiments, the set-point signal is provided by a component outside of the adaptive drive throttled switching converter. In other embodiments, the set-point signal is determined according to circuitry included within, or coupled to, the adaptive drive throttled switching converter that is operable to determine a breakdown voltage of the high-side and low-side MOSFETs of the half-bridge.

Referring now to FIG. 1, a schematic diagram of an illustrative adaptive drive strength switching converter 100 in accordance with various embodiments is shown. In an embodiment, the adaptive drive strength switching converter 100 includes a control loop 105, an analog driver 110, one or more gate drivers 115, and a capacitor 120. In some embodiments, the control loop 105 includes a peak detector (e.g., a sample-and-hold circuit) 125, a comparator 130, a counter 135, a DAC 140, an amplifier 145, and a half-bridge circuit 147 (e.g., including the n-type MOSFETs 150 (a high-side MOSFET) and 155 (a low-side MOSFET)). In some embodiments, the adaptive drive strength switching converter 100 includes a plurality of analog drivers 110 coupled in parallel. In an embodiment, the analog driver 110 includes p-type MOSFETs 160, 165, and 170 operable to drive the n-type MOSFET 150, for example, at least partially based on the control loop 105. In some embodiments, the MOSFET 160 is a component of both the control loop 105 and the analog driver 110. In some embodiments, characteristics of the MOSFET 170 at least partially determine a minimum drive strength of the analog driver 110 which may be adapted higher based on the MOSFET 160, as is discussed below.

In an embodiment, the control loop 105 controls an output of the adaptive drive strength switching converter 100 at least partially based on an output of the adaptive drive strength switching converter 100. For example, the control loop 105 controls a drive strength of the analog driver 110 based at least partially on an output signal output by the half-bridge circuit 147. The output signal of the half-bridge circuit 147 may include ringing or oscillation (which may also sometimes be referred to as ripple or undesired variation alternating above and below a desired voltage level) in the output signal that may result from a sudden change in the output signal (e.g., the output signal changing suddenly from approximately an input voltage value to approximately a ground voltage value). Driving the analog driver 110 (and correspondingly the MOSFET 150) harder (e.g., with a higher value drive signal) may result in reduced power loss of the adaptive drive strength switching converter 100 (e.g., greater efficiency) but increased ringing. Driving the analog driver 110 (and correspondingly the MOSFET 150) softer (e.g., with a lower value drive signal) may result in increased power loss of the adaptive drive strength switching converter 100 (e.g., reduced efficiency) but decreased ringing. To balance between desires for efficiency while controlling ringing, in an embodiment the control loop 105 controls the output of the adaptive drive strength switching converter 100 at least partially based on the ringing included in the output signal of the half-bridge circuit 147. For example, the control loop 105 controls the output of the adaptive drive strength switching converter 100 at least partially based on a positive portion of the ringing (e.g., the undesired variation alternating above the desired voltage level) that is included in the output signal of the half-bridge circuit 147.

To control the output of the adaptive drive strength switching converter 100 at least partially based on the ringing included in the output signal of the half-bridge circuit 147, in an embodiment the control loop 105 compares a peak value of the output signal of the half-bridge circuit 147 to a maximum desired peak value to at least partially determine a strength for driving the analog driver 110. For example, the peak detector 125 receives the output of the half-bridge circuit 147 and determines the peak value of the output signal of the half-bridge circuit 147. In some embodiments, the peak detector 125 is clocked based on a received pulse width modulation (PWM) signal (e.g., received from a component external to the adaptive drive strength switching converter 100) that is, in some embodiments, shared by other components of the adaptive drive strength switching converter 100. The peak detector 125 provides the determined peak value to the comparator 130. The comparator 130 compares the determined peak value to a received maximum desired peak value to output a comparison result indicating whether the detected peak value is greater than the maximum desired peak value or less that the maximum desired peak value. In some embodiments, the adaptive drive strength switching converter 100 (and correspondingly the comparator 130) receives the maximum desired peak value as an input signal from an external component. In other embodiments, the adaptive drive strength switching converter 100 includes circuitry (not shown) coupled to an input of the comparator 130 and operable to determine the maximum desired peak value, as discussed in greater detail below. In some embodiments, though not shown, the comparator is clocked based on the PWM signal.

The comparator 130 provides the comparison result to the counter 135. In some embodiments, the counter 135 is clocked by an inverse of the PWM signal that clocks the peak detector 125. In some embodiments, the adaptive drive strength switching converter 100 comprises one or more inverters 175 (e.g., coupled between an input of the adaptive drive strength switching converter 100 that receives the PWM signal and a clock input of the counter 135 and/or an input of the gate drivers 115). In some embodiments the adaptive drive strength switching converter 100 includes multiple inverters 175, while in other embodiments the adaptive drive strength switching converter 100 includes a single inverter 175 with an output shared by both the counter 135 and the gate drivers 115. In other embodiments, the inverter 175 is omitted and the adaptive drive strength switching converter 100 receives the inverse of the PWM signal from an external component. At each falling edge of the PWM signal, the counter 135 counts up for each received comparison result representing a logical "1" and counts down (to a minimum count of zero) for each received comparison result representing a logical "0". The counter 135 then provides this count as a digital value to the DAC 140. The DAC 140 converts the count to an analog signal that is output to, and buffered by, the amplifier 145 to create a control signal for controlling the analog driver 110. The amplifier 145 passes the control signal to the analog driver 110 (e.g., to the MOSFET 160) for driving the analog driver 110 and correspondingly the MOSFET 150.

When the control signal has a sufficiently low value (as received at a gate of the MOSFET 160) with respect to the output of the half-bridge circuit 147 (as received at a source of the MOSFET 160), a resistance of the MOSFET 160 changes and the resistance of MOSFET 160 controls the driving strength for the driver 110. Similarly, based on the PWM signal, in an embodiment a first of the gate drivers 115 drives gate terminals of the MOSFETs 165 and 170, a second of the gate drivers 115 drives a gate of a n-type MOSFET 180, and a third of the gate drivers 115 drives a gate of the MOSFET 155. The PWM signal, in some embodiments, specifies a duty cycle of the adaptive drive strength switching converter 100 at least partially by controlling portions of the analog driver 110 and/or the half-bridge circuit 147.

In an embodiment, the gate drivers 115 are digital devices that drive the MOSFETs 165, 170, 180, and 155 with a value at least partially based on supply voltages of the gate drivers 115 (e.g., rail, or rail-to-rail, voltages). For example, when the PWM signal is "1," the first of the gate drivers 115 drives the MOSFETs 165 and 170 with a "1" to cause the MOSFETs 165 and 170 to turn on and drive a gate of the MOSFET 150 to cause the MOSFET 150 to pass approximately a voltage present at a source terminal of the MOSFET 150 to a drain terminal of the MOSFET 150. This voltage present at the drain terminal of the MOSFET 150 is, in some embodiments, the output of the half-bridge circuit 147 and correspondingly, the adaptive drive strength switching converter 100. In some embodiments, the voltage present at the source terminal of the MOSFET 150 is a source or supply voltage received by the adaptive drive strength switching converter 100. Similarly, when the PWM signal is "1," the second of the gate drivers 115 and the third of the gate drivers 115 drives the MOSFET 180 and the MOSFET 155, respectively, with a "1" which is insufficient to cause the MOSFETs 180 and 155 to conduct current between their respective source and drain terminals (e.g., the MOSFETs 180 and 155 remain turned "off").

Conversely, when the PWM signal is "0," the first of the gate drivers 115 drives the MOSFETs 165 and 170 with a "0" to cause the MOSFETs 165 and 170 to turn off. Similarly, when the PWM signal is "0," the second of the gate drivers 115 and the third of the gate drivers 115 drives the MOSFET 180 and the MOSFET 155, respectively, with a "0" to cause the MOSFETs 180 and 155 to turn on. The MOSFETs 180 and 155 turning on causes the output of the half-bridge circuit 147, and correspondingly the adaptive drive strength switching converter 100, to be coupled to a ground voltage value through the MOSFET 155. In various embodiments, the output of the half-bridge circuit 147 is then provided through the control loop 105 to the peak detector 125 for use in further adapting the drive strength of the adaptive drive strength switching converter 100 to a maximum drive strength that maintains the positive portion of the ringing that is included in the output signal of the half-bridge circuit 147 below the maximum desired peak value.

Figure 2:
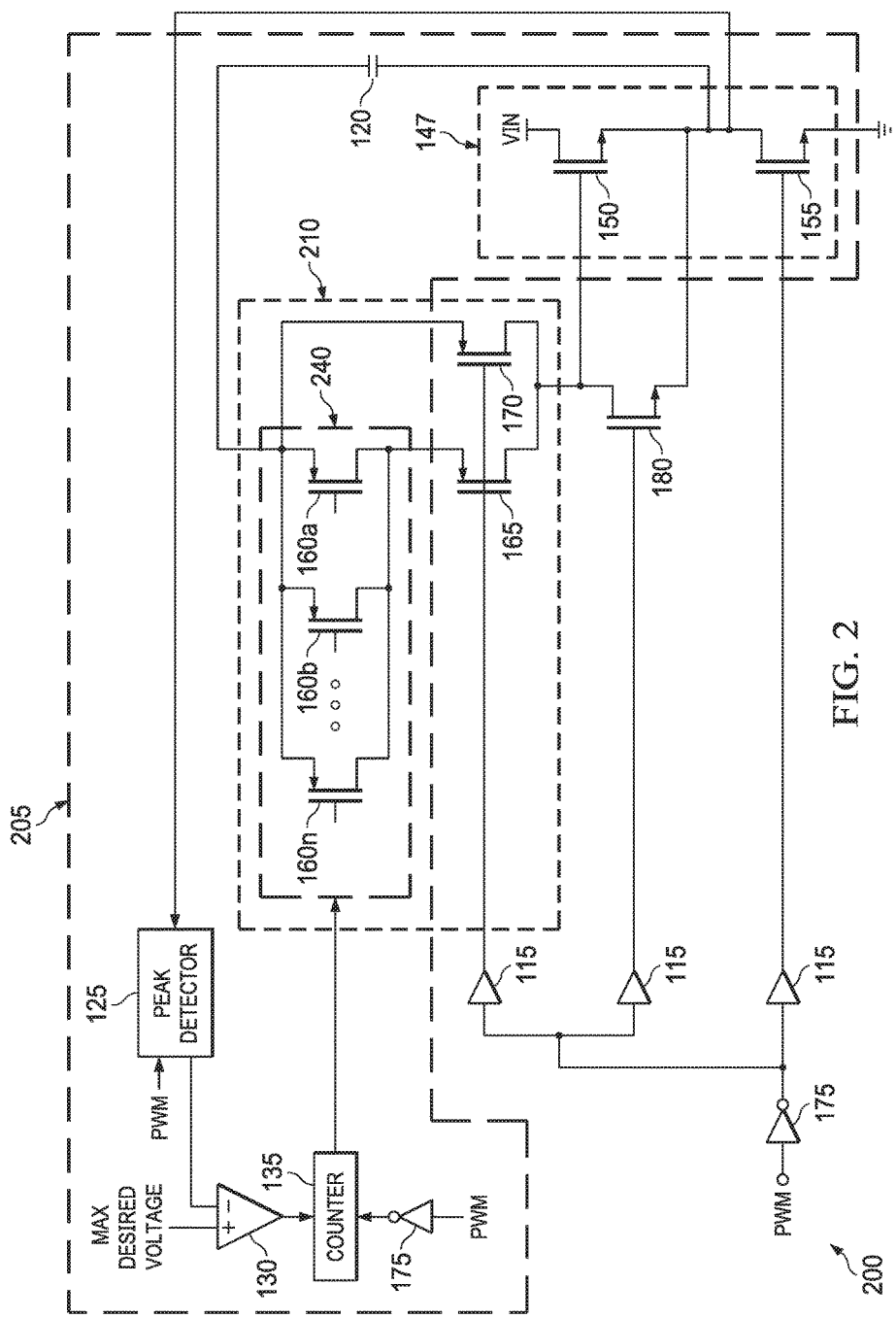
FIG. 2 shows a schematic diagram of an illustrative adaptive drive strength switching converter in accordance with various embodiments.

Referring now to FIG. 2, a schematic diagram of an illustrative adaptive drive strength switching converter 200 in accordance with various embodiments is shown. In an embodiment, the adaptive drive strength switching converter 200 includes the control loop 205, the driver 210, one or more gate drivers 115, and a capacitor 120. In some embodiments, the control loop 205 includes the peak detector 125, the comparator 130, the counter 135, and the half-bridge circuit 147 (e.g., including the n-type MOSFETs 150 and 155). In some embodiments, the adaptive drive strength switching converter 200 includes a plurality of drivers 210 coupled in parallel. In an embodiment, the driver 210 includes a plurality of p-type MOSFETs (e.g., 160a, 160b, ..., 160n) operable as a DAC 240 to convert a digital output of the counter 135 to a controllable resistor to drive the n-type MOSFET 150, for example, at least partially based on the control loop 205, and the p-type MOSFETS 165 and 170. In some embodiments, a number of the p-type MOSFETS 160n included in the DAC 240 is approximately the same as a number of steps of the counter 135.

Each of the MOSFETs 160n is configured to receive one digital bit output by the counter 135 at a gate terminal of the respective MOSFET 160n. When a MOSFET 160n receives a digital bit of "0" from the counter 135, the respective MOSFET 160n turns on. As a value of the count output by the counter 135 increases, a number of the MOSFETs 160n that are turned on increases. As the number of MOSFETs 160n that are turned on increases, the effective resistance of the combined MOSFETS 160n reduces, thereby increasing a strength with which the MOSFET 150 will be driven. In an embodiment, a remainder of the adaptive drive strength switching converter 200 (e.g., the MOSFETs 150, 155, 170, 180, and the gate drivers 115) operates substantially similarly to those of the adaptive drive strength switching converter 100, discussed above with respect to FIG. 1, and such description is not repeated herein.

Figure 3:
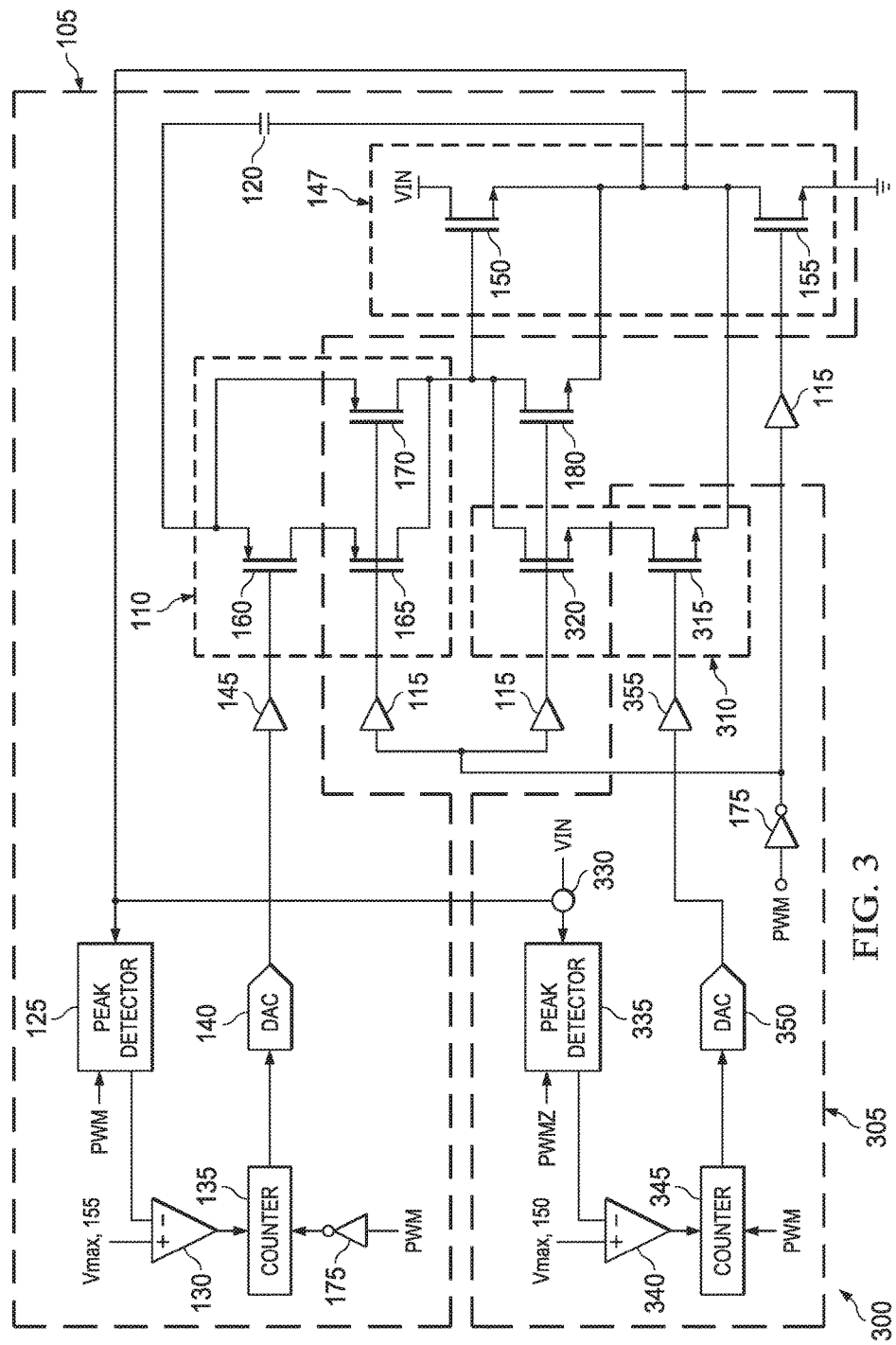
FIG. 3 shows a schematic diagram of an illustrative adaptive drive strength switching converter in accordance with various embodiments.

Referring now to FIG. 3, a schematic diagram of an illustrative adaptive drive strength switching converter 300 in accordance with various embodiments is shown. In an embodiment, the adaptive drive strength switching converter 300 includes the adaptive drive strength switching converter 100, which operates substantially as described above with respect to FIG. 1 with the comparator 130 comparing the detected peak value to a maximum desired voltage across MOSFET 155. In an embodiment, the adaptive drive strength switching converter 300 further includes a control loop 305, an analog driver 310 including n-type MOSFETs 315 and 320, and a subtractor 330. In some embodiments, the adaptive drive strength switching converter 300 includes a plurality of analog drivers 310 coupled in parallel. In some embodiments, the control loop 305 includes a peak detector 335, a comparator 340, a counter 345, a DAC 350, and an amplifier 355. In some embodiments, the MOSFET 315 is a component of both the control loop 305 and the analog driver 310. In some embodiments, the control loop 105 further includes the half-bridge circuit 147.

In an embodiment, the control loop 305 controls the output of the adaptive drive strength switching converter 300 at least partially based on the output of the adaptive drive strength switching converter 300. For example, the control loop 305 controls a drive strength of the analog driver 310 based at least partially on the output signal output by the half-bridge circuit 147, for example, at least partially based on a maximum desired voltage across MOSFET 150 of the half-bridge circuit 147. In this way, in an embodiment the control loops 105 and 305 together are operable to adapt the drive strength of the adaptive drive strength switching converter 300 to a maximum drive strength. This adaptive driving maintains the positive portion of the ringing that is included in the output signal of the half-bridge circuit 147 below the maximum desired voltage across MOSFET 155 and the positive portion of the ringing across MOSFET 150 below the maximum desired voltage across MOSFET 150. The maximum drive strength, in some embodiments, results in more efficient operation of the MOSFET 150 and/or MOSFET 155 when compared to operation at a drive strength less than the maximum drive strength.

In an embodiment the control loop 305 compares a peak value of the input or supply voltage of the adaptive drive strength switching converter 300 minus the output signal of the half-bridge circuit 147 to a maximum desired voltage across MOSFET 150 to at least partially determine a strength for driving the analog driver 310. For example, in one embodiment the subtractor 330 receives the supply voltage of the adaptive drive strength switching converter 300 and the output of the half-bridge circuit 147 and provides a difference between the signals to the peak detector 335. In another embodiment, the difference between the signals is provided by a component external to the adaptive drives strength switching converter 300 and the adaptive drives strength switching converter 300 does not include the subtractor 330. The peak detector 335 then determines the peak value of the input or supply voltage minus the output signal of the half-bridge circuit 147. In some embodiments, the peak detector 335 is clocked based on the PWM signal. The peak detector 335 provides the determined peak value to the comparator 340.

The comparator 340 compares the determined peak value to the maximum desired voltage across MOSFET 150 to output a comparison result indicating whether the detected peak value is greater than the maximum desired voltage across MOSFET 150 or less than the maximum desired voltage across MOSFET 150. In some embodiments, though not shown, the comparator 340 is clocked based on the PWM signal. In some embodiments, the adaptive drive strength switching converter 300 (and correspondingly the comparator 340) receives the maximum desired voltage across MOSFET 150 as an input signal from an external component, while in other embodiments the adaptive drive strength switching converter 300 includes circuitry (not shown) coupled to an input of the comparator 340 and operable to determine the maximum desired voltage across MOSFET 150, as discussed in greater detail below.

The comparator 340 provides the comparison result to the counter 345. In some embodiments, the counter 345 is clocked by the PWM signal. At each rising edge of the PWM signal, the counter 345 counts up for each received comparison result representing a logical "1" and counts down (to a minimum count of zero) for each received comparison result representing a logical "0". The counter 345 then provides this count as a digital value to the DAC 350. The DAC 350 converts the count to an analog signal that is output to, and buffered by, the amplifier 355 to create a control signal for controlling the analog driver 110. The amplifier 355 passes the control signal to the analog driver 310 (e.g., to the MOSFET 315) for driving the analog driver 310 and correspondingly the MOSFET 150.

When the control signal has a sufficiently high value (as received at a gate of the MOSFET 315) with respect to the output of the half-bridge circuit 147 (as received at a source of the MOSFET 315), a resistance of the MOSFET 315 changes and the resistance of MOSFET 315 controls the driving strength for turning off MOSFET 150. Similarly, based on the PWM signal, the second of the gate drivers 115, discussed above with respect to FIG. 1, drives a gate of the MOSFET 320 substantially similarly to the driving of the MOSFET 180. The PWM signal, in some embodiments, specifies a duty cycle of the adaptive drive strength switching converter 300 at least partially by controlling portions of the analog driver 310 (in addition to the analog driver 110 of FIG. 1) and/or the half-bridge circuit 147.

When the PWM signal is "1," the second of the gate drivers 115 drives the MOSFET 320 with a "1," which is insufficient to cause the MOSFET 320 to conduct current between its source and drain terminals (e.g., the MOSFET 320 remains turned "off"). Conversely, when the PWM signal is "0," the second of the gate drivers 115 drives the MOSFET 320 with a "0" to cause the MOSFET 320 to turn on. In this way, the MOSFET 150 is driven at a maximum value such that both positive and negative portions of ringing in an output of the half-bridge circuit 147 are maintained below desired levels while providing for optimal efficiency of the MOSFET 150 at least partially as a result of the maximum drive strength.

Figure 4:
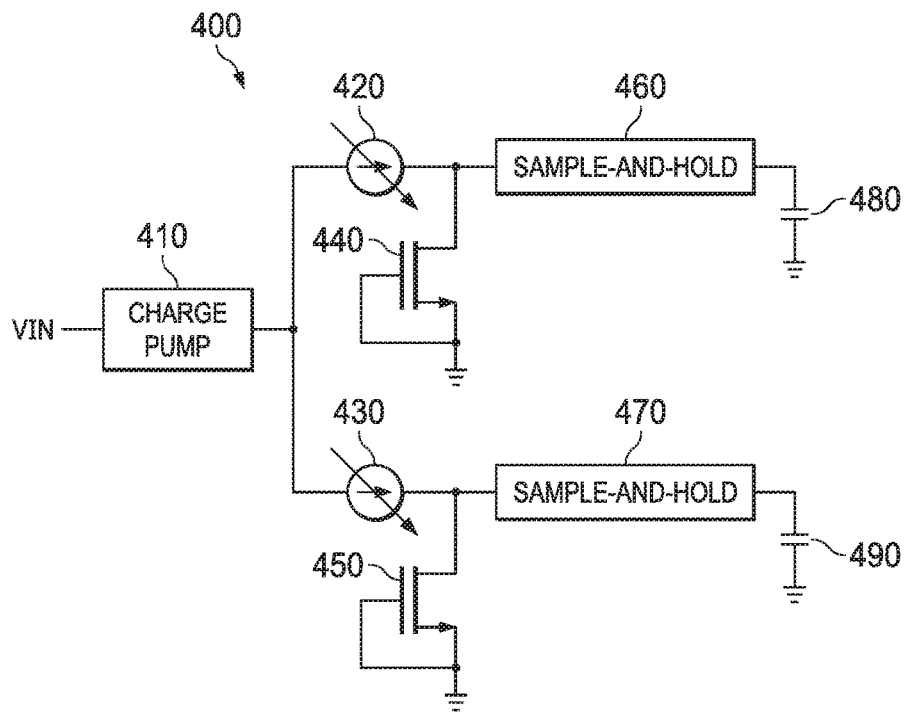
FIG. 4 shows a schematic diagram of an illustrative measurement circuit in accordance with various embodiments.

Referring now to FIG. 4, a schematic diagram of an illustrative measurement circuit 400 in accordance with various embodiments is shown. In some embodiments, the measurement circuit 400 is implemented in at least one of the adaptive drive strength switching converters 100, 200, or 300 to determine and provide at least one of the maximum desired peak value, the maximum desired voltage across MOSFET 150, and/or the maximum desired voltage across MOSFET 155. In other embodiments the measurement circuit 400 is implemented external to, and coupled to, at least one of the adaptive drive strength switching converters 100, 200, or 300.

In an embodiment, the measurement circuit 400 includes a charge pump 410, a current source 420, a current source 430, a MOSFET 440, a MOSFET 450, a sample and hold circuit 460, a sample and hold circuit 470, a capacitor 480, and a capacitor 490. In an embodiment, the MOSFET 440 and the MOSFET 450 are substantially to similar (e.g., a replica of) the MOSFET 150 and the MOSFET 155, respectively, of the adaptive drive strength switching converters 100, 200, and/or 300. In an embodiment, the charge pump 410 receives an input or supply voltage and provides a voltage to each of the current source 420 and the current source 430. The current source 420 pushes current through the MOSFET 440 to cause the MOSFET 440 to enter a breakdown operation mode. By way of the similarity of the MOSFET 440 to the MOSFET 150, a voltage across the MOSFET 440 when the MOSFET 440 enters the breakdown operation mode is, in some embodiments, the maximum desired voltage across MOSFET 150. The sample and hold circuit 460 samples the voltage present across the MOSFET 440 and outputs the sampled voltage, for example, for use by any of the adaptive drive strength switching converter 100, 200, or 300, as discussed above with respect to FIGS. 1, 2, and 3, respectively. In some embodiments, the sampled voltage is further stored in the capacitor 480.

Similarly, the current source 430 pushes current through the MOSFET 450 to cause the MOSFET 450 to enter a breakdown operation mode. By way of the similarity of the MOSFET 450 to the MOSFET 155, a voltage across the MOSFET 450 when the MOSFET 450 enters the breakdown operation mode is, in some embodiments, the maximum desired voltage across MOSFET 155. The sample and hold circuit 470 samples the voltage present across the MOSFET 450 and outputs the sampled voltage, for example, for use by any of the adaptive drive strength switching converters 100, 200, or 300, as discussed above with respect to FIGS. 1, 2, and 3, respectively. In some embodiments, the sampled voltage is further stored in the capacitor 490. By use of the measurement circuit 400, in some embodiments variations in breakdown voltages of the MOSFET 440 and/or the MOSFET 450, for example, as a result of temperature, manufacturing process, walk-in/walk-out (e.g., drift), and other variable characteristics are compensated for in determining at least one of the maximum desired peak value, the maximum desired voltage across MOSFET 150, and/or the maximum desired voltage across MOSFET 155. The measurement circuit 400, in some embodiments, further provides for a more precise maximum desired peak value, the maximum desired voltage across MOSFET 150, and/or the maximum desired voltage across MOSFET 155 by way of its dynamic determination when compared to a fixed or set value for the maximum desired peak value, the maximum desired voltage across MOSFET 150, and/or the maximum desired voltage across MOSFET 155, for example, as discussed above with respect to FIG. 1.

Figure 5:
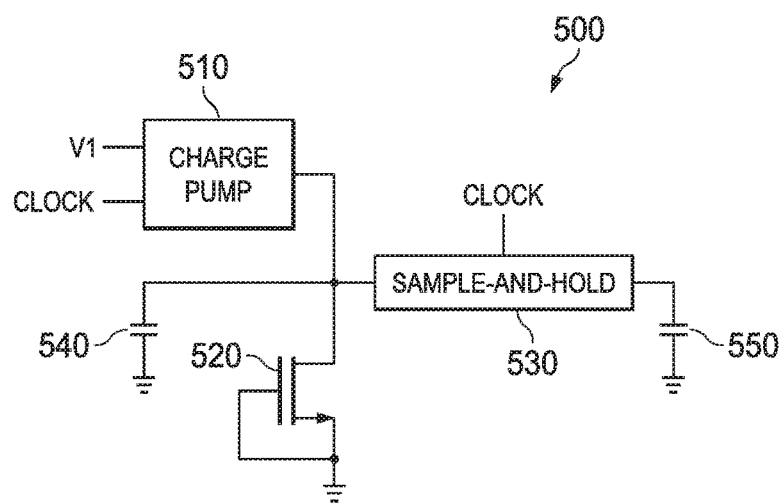
FIG. 5 shows a schematic diagram of an illustrative measurement circuit in accordance with various embodiments.

Referring now to FIG. 5, a schematic diagram of an illustrative measurement circuit 500 in accordance with various embodiments is shown. In some embodiments, the measurement circuit 500 is implemented in at least one of the adaptive drive strength switching converter 100, 200, or 300 to determine and provide one of the maximum desired peak value, the maximum desired voltage across MOSFET 150, or the maximum desired voltage across MOSFET 155. In other embodiments the measurement circuit 500 is implemented external to, and coupled to, at least one of the adaptive drive strength switching converters 100, 200, or 300. In various embodiments, one or more additional measurement circuits 500 are implemented to provide one or more additional of the maximum desired peak value, the maximum desired voltage across MOSFET 150, and/or the maximum desired voltage across MOSFET 155.

In an embodiment, the measurement circuit 500 includes a charge pump 510, a MOSFET 520, a sample and hold circuit 530, a capacitor 540, and a capacitor 550. In an embodiment of the measurement circuit 500 operable to determine and provide the maximum desired voltage across MOSFET 155, the MOSFET 520 is substantially similar to (e.g., a replica of) the MOSFET 155 of the adaptive drive strength switching converters 100, 200, and/or 300. Conversely, in an embodiment of the measurement circuit 500 operable to determine and provide the maximum desired voltage across MOSFET 150, the MOSFET 520 is substantially similar to the MOSFET 150 of the adaptive drive strength switching converter 100, 200, and/or 300. In an embodiment, a capacitance value of the capacitor 540 is less than an internal capacitance of the charge pump 510.

In an embodiment, the charge pump 510 receives an input or supply voltage and a clock signal (e.g., such as the PWM signal) and provides a voltage across the capacitor 540 and the MOSFET 520 to cause the MOSFET 520 to enter a breakdown operation mode. By way of the similarity of the MOSFET 520 to the MOSFET 155 (in an embodiment of the measurement circuit 500 operable to determine and provide the maximum desired voltage across MOSFET 155), a voltage across the MOSFET 520 when the MOSFET 520 enters the breakdown operation mode is, in some embodiments, the maximum desired voltage across MOSFET 155. The sample and hold circuit 530 samples the voltage present across the MOSFET 520 at a frequency determined by a received clock signal (e.g., such as the PWM signal) and outputs the sampled voltage, for example, for use by any of the adaptive drive strength switching converters 100, 200, or 300, as discussed above with respect to FIGS. 1, 2, and 3, respectively. In some embodiments, the sampled voltage is further stored in the capacitor 550.

By use of the measurement circuit 500, in some embodiments variations in breakdown voltages of the MOSFET 520, for example, as a result of temperature, manufacturing process, walk-in/walk-out (e.g., drift), and other variable characteristics are compensated for in determining one of the maximum desired peak value, the maximum desired voltage across MOSFET 150, or the maximum desired voltage across MOSFET 155. The measurement circuit 500, in some embodiments, further provides for a more precise maximum desired peak value, the maximum desired voltage across MOSFET 150, or the maximum desired voltage across MOSFET 155 by way of its dynamic determination when compared to a fixed or set value for the maximum desired peak value, the maximum desired voltage across MOSFET 150, or the maximum desired voltage across MOSFET 155, for example, as discussed above with respect to FIG. 1.

Figure 6:
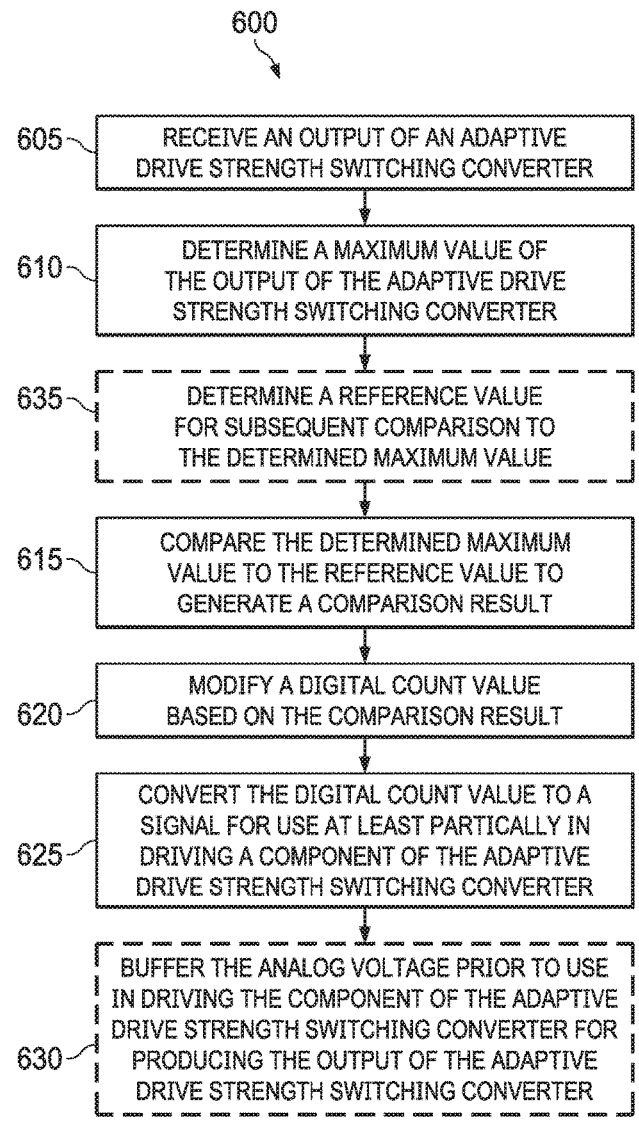
FIG. 6 shows a flowchart of an illustrative method of controlling an adaptive drive strength switching converter in accordance with various embodiments.

Referring now to FIG. 6, a flowchart of an illustrative method 600 of controlling an adaptive drive strength switching converter in accordance with various embodiments is shown. In an embodiment, the method 600 is implemented using any one or more of the adaptive drive strength switching converters 100, 200, and/or 300. At operation 605, a control loop (e.g., such as the control loop 105 and/or 305, discussed above) of the adaptive drive strength switching converter receives an output of the adaptive drive strength switching converter. The output of the adaptive drive strength switching converter is provided, for example, by a half-bridge circuit of the adaptive drive strength switching converter. At operation 610, the control loop determines a maximum value of the output of the adaptive drive strength switching converter. In an embodiment, the control loop determines the maximum value of the output of the adaptive drive strength switching converter according to a peak detector, as discussed above.

At operation 615, the control loop compares the determined maximum value of the output of the adaptive drive strength switching converter to a reference value to generate a comparison result. In an embodiment, the reference value is a desired maximum value for the output of the adaptive drive strength switching converter and/or a desired maximum voltage across a component of the adaptive drive strength switching converter (e.g., such as a transistor of the half-bridge). In an embodiment, the output of the adaptive drive strength switching converter is compared to the reference value by a comparator, as discussed above. At operation 620, the control loop modifies a digital count value based on the comparison result. For example, when the comparison result is a logic level "1," the control loop increments the digital count value and when the comparison result is a logic level "0," the control loop decrements the digital count value. In an embodiment, the control loop modifies the digital count value by a counter, as discussed above.

At operation 625, the control loop converts the digital count value to a signal for use at least partially in driving a component of the adaptive drive strength switching converter for producing the output of the adaptive drive strength switching converter. In an embodiment, the control loop converts the digital count value to the signal using a DAC, as discussed above, such that the signal is an analog signal. In another embodiment, the control loop converts the digital count value to the signal using one or more transistors (such as p-type MOSFETS (PMOS) transistors) such that the signal is representative of a PMOS resistance.

Optionally, in an embodiment, at operation 630 the signal is buffered prior to use in driving the component of the adaptive drive strength switching converter for producing the output of the adaptive drive strength switching converter. For example, the signal is buffered when the signal is the analog signal, as discussed above. In an embodiment, the signal is buffered by an amplifier. In an embodiment, the component driven by the signal (or the buffered signal) is a component of an analog driver circuit, as discussed above. In another embodiment, the component driven by the signal (or the buffered signal) is a component of the half-bridge of the adaptive drive strength switching converter. In some embodiments, the method 600 further, and optionally, includes operation 635. At operation 635 the control loop determines the reference value to which the determined maximum value of the output of the adaptive drive strength switching converter is compared at operation 615. In an embodiment, the control loop determines the reference value via a measurement circuit, as discussed above, for example, by pushing a MOSFET to operate in a breakdown operation region.

While the operations of the method 600 have been discussed and labeled with numerical references, it should be noted that the method 600 may include additional operations that are not recited herein, any one or more of the operations recited herein may include one or more sub-operations, any one or more of the operations recited herein may be omitted, and/or any one or more of the operations recited herein may be performed in an order other than that presented herein (e.g., in a reverse order, substantially simultaneously, overlapping, etc.), all of which are intended to fall within the scope of the present disclosure.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. Unless otherwise stated, "about", "approximately", or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A switching converter, comprising:
a driver having an input and a driver output;
a half-bridge circuit having an input and an output, the input of the half-bridge circuit coupled to the driver output;
a control loop comprising: a peak detector having an input and a detector output, the input of the peak detector coupled to the output of the half-bridge circuit, the peak detector configured to generate a detected peak value at the detector output responsive to the output of the half-bridge circuit; a comparator having an input and a comparator output, the input of the comparator coupled to the detector output, the comparator configured to generate a comparison result at the comparators output responsive to a comparison by the comparator of the detected peak value to a particular value; a counter having an input and a digital count output, the input of the counter coupled to the comparator output, the counter configured to modify a digital count at the digital count output according to the comparison result; and a digital-to-analog converter (DAC) having a digital input and an analog output, the digital input coupled to the digital count output, the analog output coupled to the input of the driver, and the DAC configured to convert the digital count to an analog signal at the analog output; and
a measurement circuit coupled to the output of the half-bridge circuit, the measurement circuit configured to determine the particular value responsive to the output of the half-bridge circuit.

2. The switching converter of claim 1, further comprising: an amplifier having an input and an output, the input of the amplifier coupled to the analog output of the DAC, and the output of the amplifier coupled to the input of the driver, the amplifier configured to buffer the analog signal from the DAC.

3. The switching converter of claim 1, wherein the half-bridge circuit comprises a high-side metal oxide semiconductor field effect transistor (MOSFET) and a low-side MOSFET, and the driver is operable to drive the high-side MOSFET responsive to the output of the half-bridge circuit.

4. The switching converter of claim 1, wherein the measurement circuit comprises:
a charge pump;
a metal oxide semiconductor field effect transistor (MOSFET) coupled to the charge pump; and
a sample-and-hold circuit coupled to the MOSFET, the MOSFET being a replication of at least a portion of the half-bridge circuit.

5. The switching converter of claim 4, wherein the measurement circuit further comprises a current source having an input and an output, the input of the current source coupled to the charge pump, and the output of the current source coupled to the MOSFET and the sample-and-hold circuit.

6. A control loop, comprising:
a peak detector having an input and a detector output, the input of the peak detector adapted to be coupled to an output of a half-bridge circuit;
a measurement circuit comprising: a charge pump; a metal oxide semiconductor field effect transistor (MOSFET) coupled to the charge pump; and a sample-and-hold circuit having an input and an output, the input of the sample-and-hold circuit coupled to the MOSFET, the output of the sample-and-hold circuit having a particular reference value, and the MOSFET being a replication of at least a portion of the half-bridge circuit;
a comparator having: a first input coupled to the detector output; a second input coupled to the output of the sample-and-hold circuit; and a comparator output;
a counter having an input and a digital count output, the input of the counter coupled to the comparator output; and
a digital-to-analog converter (DAC) having a digital input and an analog output, the digital input coupled to the digital count output.

7. The control loop of claim 6, further comprising an amplifier having an input coupled to the analog output.

8. The control loop of claim 6, wherein the DAC comprises a plurality of metal oxide semiconductor field effect transistors (MOSFETs) coupled in parallel.

9. The control loop of claim 6, wherein the input of the peak detector is adapted to be coupled to the output of the half-bridge circuit, and the control loop is configured to:
receive a signal at the input of the peak detector
by the peak detector, determine a maximum value of the signal to provide as a detected value at the detector output;
by the comparator, compare the detected value to the particular reference value to form a comparison result at the comparator output;
by the counter, modify a digital count value at the digital count output responsive to the comparison result; and
by the DAC, convert the digital count value to an analog signal at the analog output.

10. The control loop of claim 6, wherein the measurement circuit further comprises a current source having an input and an output, the input of the current source coupled to the charge pump, and the output of the current source coupled to the MOSFET and the sample-and-hold circuit.

11. A method, comprising:
receiving an output of a switching converter;
determining a maximum value of the output of the switching converter;
comparing the maximum value of the output of the switching converter to a reference value to generate a comparison result;

modifying a digital count value responsive to the comparison result;

converting the digital count value to a signal at least partially usable to drive a component of the switching converter, wherein the component at least partially produces the output of the switching converter; and determining the reference value by pushing a metal oxide semiconductor field effect transistor (MOSFET) to operate in a breakdown operation region.

12. The method of claim 11, further comprising buffering the signal prior to use in driving the component of the switching converter for producing the output of the switching converter.

* * * * *